United States Patent
Cimaz

(10) Patent No.: US 10,439,439 B2
(45) Date of Patent: Oct. 8, 2019

(54) METHOD AND DEVICE FOR THE CONTACTLESS ENERGY TRANSFER TO AN APPARATUS EQUIPPED WITH A LOUDSPEAKER

(71) Applicant: STMicroelectronics (Grand Ouest) SAS, Delarue (FR)

(72) Inventor: Lionel Cimaz, Pleumeleuc (FR)

(73) Assignee: STMicroelectronics (Grand Ouest) SAS, Delarue (FR)

( * ) Notice: Subject to any disclaimer, the term of this patent is extended or adjusted under 35 U.S.C. 154(b) by 83 days.

(21) Appl. No.: 15/693,188

(22) Filed: Aug. 31, 2017

(65) Prior Publication Data

US 2018/0233950 A1  Aug. 16, 2018

(30) Foreign Application Priority Data

Feb. 13, 2017  (FR) .................... 17 51150

(51) Int. Cl.
| | | |
|---|---|---|
| H04R 3/00 | (2006.01) | |
| H02J 50/12 | (2016.01) | |
| H03F 3/183 | (2006.01) | |
| H03F 1/56 | (2006.01) | |
| H02J 7/00 | (2006.01) | |
| H02J 50/10 | (2016.01) | |

(52) U.S. Cl.
CPC ............ H02J 50/12 (2016.02); H02J 7/0042 (2013.01); H02J 50/10 (2016.02); H03F 1/565 (2013.01); H03F 3/183 (2013.01); H04R 3/00 (2013.01); H03F 2200/03 (2013.01); H03F 2200/387 (2013.01); H04R 2420/07 (2013.01)

(58) Field of Classification Search
CPC .......... H02J 50/12; H02J 50/10; H02J 7/0042; H04R 3/00; H04R 2420/07; H03F 1/565; H03F 3/183; H03F 2200/03; H03F 2200/387; H04B 3/00; H04B 5/02
USPC .................... 381/77, 120, 331, 111
See application file for complete search history.

(56) References Cited

U.S. PATENT DOCUMENTS

| | | | |
|---|---|---|---|
| 10,044,232 B2 * | 8/2018 | Crosby ................. | H02J 5/005 |
| 2010/0044144 A1 | 2/2010 | Tajima et al. | |
| 2010/0295378 A1 | 11/2010 | Suzuki et al. | |
| 2011/0037321 A1 * | 2/2011 | Chatterjee ............... | H02J 17/00 |
| | | | 307/104 |
| 2012/0163619 A1 * | 6/2012 | Kinoshita ............... | H02J 17/00 |
| | | | 381/77 |
| 2013/0272563 A1 * | 10/2013 | Boyd ...................... | H04R 1/00 |
| | | | 381/406 |

(Continued)

FOREIGN PATENT DOCUMENTS

| | | | | |
|---|---|---|---|---|
| CN | 103260114 A | | 8/2013 | |
| JP | 4407154 | * | 2/2010 | ............ H02J 17/00 |

(Continued)

*Primary Examiner* — Paul Kim
*Assistant Examiner* — Ubachukwu A Odunukwe
(74) *Attorney, Agent, or Firm* — Slater Matsil, LLP

(57) ABSTRACT

A device includes a first module having an electromagnetic loudspeaker having an inductive element configured to drive a membrane of the electromagnetic loudspeaker. A second module is coupled between the inductive element and a load. The second module is configured to carry out a contactless transfer of energy from an emitter to the load via the inductive element.

25 Claims, 3 Drawing Sheets

(56) References Cited

U.S. PATENT DOCUMENTS

2017/0127196 A1* 5/2017 Blum .................. H02J 50/80
2018/0064224 A1* 3/2018 Brzezinski ............ H02J 7/0013

FOREIGN PATENT DOCUMENTS

JP          2010035287 A     2/2010
JP          2010035297 A     2/2010

* cited by examiner

METHOD AND DEVICE FOR THE CONTACTLESS ENERGY TRANSFER TO AN APPARATUS EQUIPPED WITH A LOUDSPEAKER

CROSS-REFERENCE TO RELATED APPLICATIONS

This application claims priority to French Patent Application No. 1751150, filed on Feb. 13, 2017, which application is hereby incorporated herein by reference.

TECHNICAL FIELD

Embodiments of the invention and their implementation relate to a method and device for the contactless energy transfer to an apparatus equipped with a loudspeaker.

BACKGROUND

Generally speaking, according to one of the various existing contactless charging standards, such as the Qi standard developed by the "Wireless Power Consortium" (WPC) commonly known to those skilled in the art, a contactless (or wireless) energy transfer system comprises an emitter device comprising a resonant circuit generating a magnetic field via an inductive element, such as a coil, of the resonant circuit, the resonant circuit being, for example, driven by a pulsed power signal, and a receiver device comprising a receiving inductive element configured for sensing the magnetic field, a rectifier circuit and a filtering capacitor configured for delivering the energy received via the inductive element to an internal or external load.

With respect to a conventional wired system for energy transfer, such a contactless energy transfer system exhibits certain advantageous characteristics such as a compact size and a resistance to water and to dust, which are particularly advantageous for applications to portable electronic devices such as a "Smart Watch".

In general, such applications also incorporate at least one loudspeaker for producing a sound. However, such a loudspeaker is commonly bulky in volume.

There accordingly exists a need to carry out a combination of such a contactless energy transfer system and of at least one loudspeaker in the applications of portable electronic devices in such a manner as to further reduce their overall size while at the same time conserving the advantageous characteristics.

SUMMARY

Embodiments of the invention and their implementation relate to the contactless transfer of energy from an emitter device to a receiver device. In particular, a receiver device comprising at least one electromagnetic loudspeaker for, by way of example but not limited to, powering a component of the receiver device or recharging a battery associated with the receiver device.

Thus, according to one embodiment and its implementation, a technical solution is provided, which is of low complexity and of limited size for combining, within one and the same device, a loudspeaker comprising an inductive element and a receiver for contactless energy transfer jointly using the inductive element of the loudspeaker.

According to one aspect, a method is provided for contactless energy transfer between an emitter and a device comprising at least one electromagnetic loudspeaker comprising an inductive element configured for driving the membrane of the loudspeaker. The transfer of energy is carried out via the inductive element.

Such a method advantageously allows a multiple use of the inductive element of the loudspeaker, because the frequency of audio signals is generally limited to 20 KHz, whereas the resonance frequency for the contactless transfer of energy is commonly higher than 110 KHz. Such a distribution of frequencies advantageously allows simultaneous operations of the loudspeaker and of the transfer of energy via the inductive element.

According to another aspect, a device is provided comprising a first module comprising at least one electromagnetic loudspeaker having an inductive element configured for driving the membrane of the loudspeaker and a second module configured for performing a contactless transfer of energy from an emitter to a load of the device via the inductive element.

In other words, the second module of the device advantageously uses the inductive element of the loudspeaker as a receiver coil of a conventional contactless energy transfer system, whereas the loudspeaker uses it for generating a sound. Thus, the fact that the second module no longer needs a dedicated inductive element will lead to a reduction in the size of the combination of the first and second modules.

It should be noted that the loudspeaker preferably does not contain any electrically-conductive component aside from the inductive element.

Furthermore, the shape and the position of the inductive element are configured in order to establish a good magnetic coupling with the emitter.

According to one embodiment, the first module comprises an audio amplifier circuit configured for transmitting first signals to the inductive element.

The second module comprises a transfer circuit configured for receiving second signals from the inductive element.

The first module comprises a first matching circuit coupled between the inductive element and the amplifier circuit configured for allowing a transmission of the first signals to the inductive element and for prohibiting a transfer of the second signals to the audio amplifier circuit.

The second module comprises a second matching circuit coupled between the inductive element and the transfer circuit configured for allowing a transmission of the second signals to the transfer circuit and prohibiting a transfer of the first signals to the transfer circuit.

The first matching circuit may comprise here, for example, a resonant circuit having a main resonance frequency and configured so as to exhibit, when the second signals have a frequency higher than the main resonance frequency, a first sufficiently high impedance between the amplifier circuit and the inductive element in such a manner as to prohibit the transfer of the second signals to the audio amplifier circuit.

The first impedance may, for example, have a value of at least 20 ohms in the range of frequencies of the wireless charging carried out by the second module, and a value of at least 200 ohms when the second signals have a frequency higher than the main resonance frequency.

By way of a non-limiting example, this resonance frequency is of the order of 135 KHz.

The second matching circuit may, for example, comprise a capacitive stage configured so as to have, when the first signals are received, a second sufficiently high impedance with respect to the impedance of the inductive element.

By way of a non-limiting example, the second impedance may be at least ten times higher than the impedance of the inductive element.

According to another embodiment, the device comprises a driver circuit coupled to the inductive element and configured for driving, respectively and exclusively, the first and second modules.

Furthermore, the membrane of the loudspeaker is driven by the inductive element and movements of the membrane also cause changes in the position of the inductive element, together with variations in the quality of magnetic coupling between the inductive element and the emitter.

For this purpose, the device may, for example, comprise a control circuit configured for applying a DC voltage, in a controlled manner, to the inductive element.

According to yet another aspect, an electronic apparatus is provided, for example, of the wireless speaker unit or MP3 player type, incorporating a device such a defined hereinabove.

BRIEF DESCRIPTION OF THE DRAWINGS

Other advantages and features of the invention will become apparent upon studying the detailed description of embodiments and their implementation, taken by way of non-limiting examples and illustrated by the appended drawings, in which.

DETAILED DESCRIPTION OF ILLUSTRATIVE EMBODIMENTS

Figure 1:
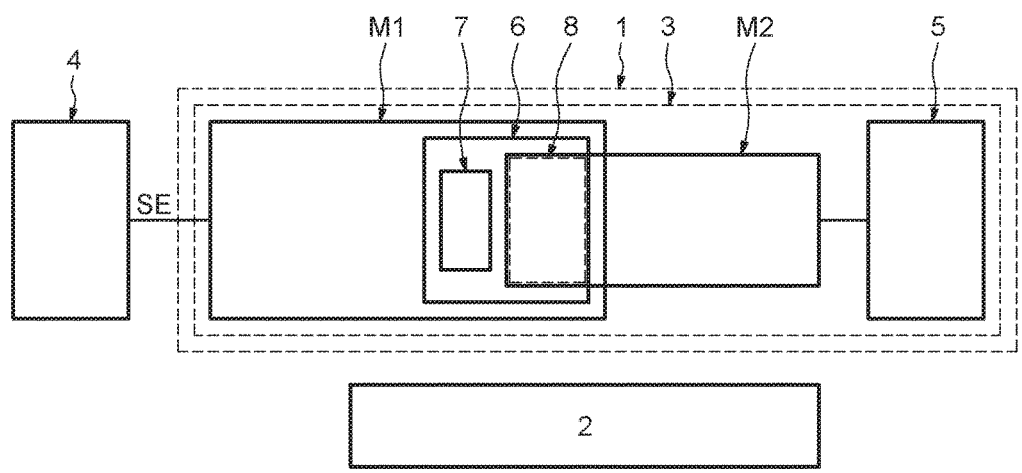
FIGS. 1 to 3 relate to various embodiments of the invention and their implementation.

In FIG. 1, the reference 1 here denotes an electronic apparatus. For example, a portable wireless speaker unit. The reference 2 here denotes an emitter for wireless energy transfer designed for the contactless transfer of energy magnetically.

The electronic apparatus 1 comprises a device 3 equipped with a first loudspeaker module M1 designed to produce sounds starting from electrical signals SE delivered by an input audio source 4, for example, an MP3 player or a mobile telephone, coupled to the apparatus with a wired, for example, via a fiber optic cable, or wireless, for example, via WiFi (for "Wireless Fidelity"), connection or more commonly via the communications standard known as "Bluetooth", and with a second module M2 dedicated to a wireless energy transfer, designed to be magnetically coupled with the emitter 2 in such a manner as to receive the energy without contact emitted by the emitter 2 and to charge a load 5, here for example a battery of the device 3.

The first module M1 comprises at least one loudspeaker 6 each comprising a membrane 7 and an inductive element 8, here, for example, a coil, in order to drive the membrane 7 as a function of the signals SE.

The second module M2 also comprises the inductive element 8 in order to use it as a receiving inductive element.

It should be noted that the apparatus 1 described here may, for example, be designed to operate according to the Qi standard but the invention is in no way limited to this particular example and may notably be applied to any field in which there is a magnetic coupling between an emitter and a receiver of a device, the device furthermore comprising a load and a loudspeaker comprising an inductive element, the receiver being configured for carrying out a transfer of energy from the emitter to the load of the device via the inductive element.

Figure 2:
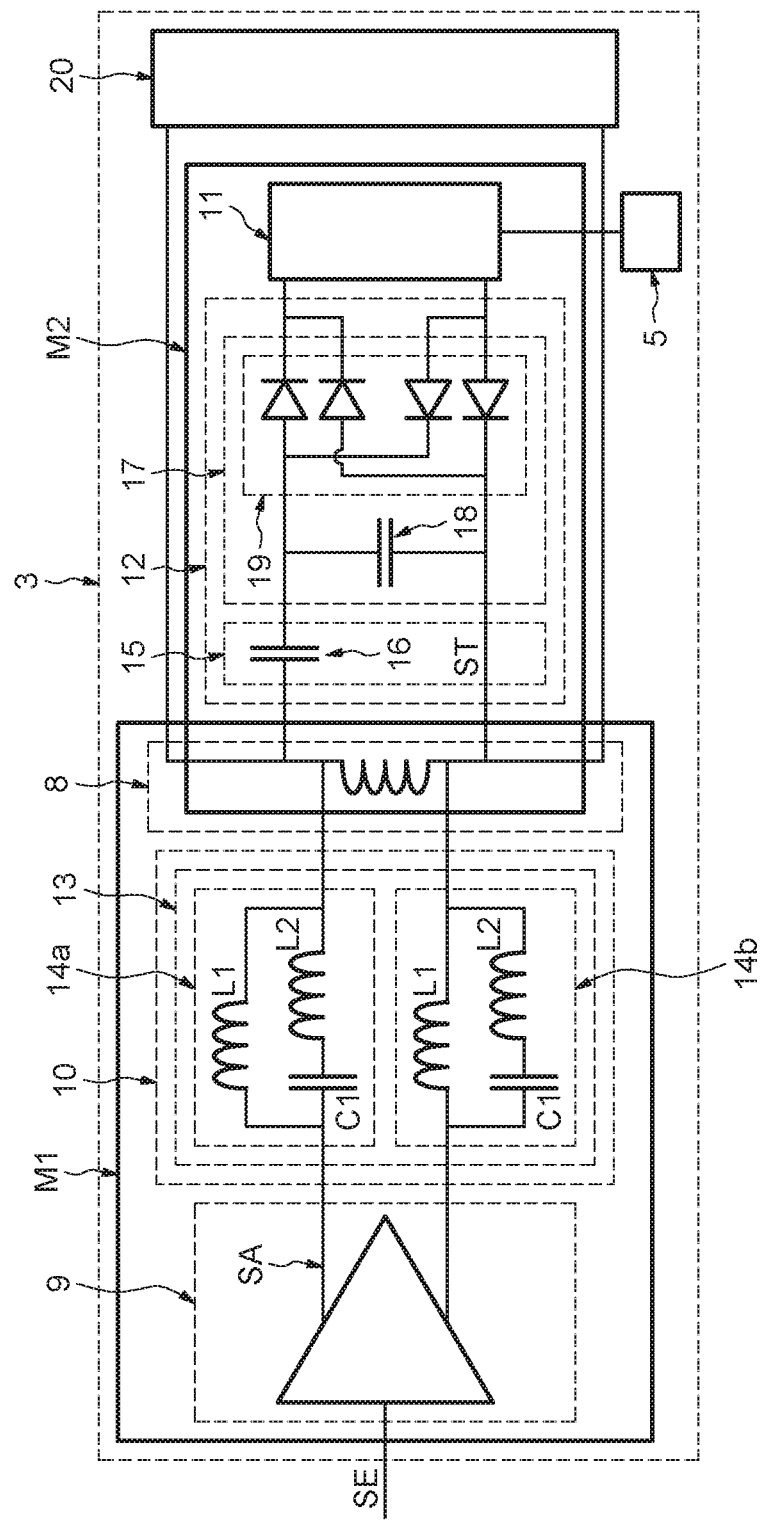

Reference is now made to FIG. 2 in order to illustrate more precisely the device 3 according to one embodiment of the invention.

The first module M1 of the device 3 comprises an audio amplifier circuit 9 configured for receiving the electrical signals SE and for transforming them into audio signals SA designed to be transmitted to the coil 8 of the loudspeaker 6, and a first matching circuit 10 coupled between the coil 8 and the audio amplifier circuit 9.

The second module M2 of the device 3 comprises a transfer circuit 11 configured for receiving transfer signals ST from the coil, and to use them for charging the load 5 of the device 3, and a second matching circuit 12 coupled between the coil 8 and the transfer circuit 11.

In order to allow first and second modules M1 and M2 to operate, respectively and simultaneously, using the same coil 8, the first matching circuit 10 is configured for enabling a transmission of the audio signals SA to the coil 8 and for prohibiting a transfer of the transfer signals ST to the audio amplifier circuit 9, whereas the second matching circuit 12 is configured for enabling a transmission of the transfer signals ST to the transfer circuit 11 and for prohibiting a transfer of the audio signals SA to the transfer circuit 11.

It should be noted that the maximum frequency of the audio signals SA is conventionally limited to 20 KHz owing to the natural limit of the human ear and the frequency band of the transfer signals ST for a contactless transfer of energy at low power up to 5 W is situated between 100 and 205 KHz according to the Qi standard. The first and second matching circuits 10 and 12 are, as a consequence, configured to take advantage of this distribution in frequency.

By way of non-limiting example, the first matching circuit 10 comprises a resonant circuit 13 comprising a first LC circuit 14$a$ and a second LC circuit 14$b$ coupled in parallel between the audio amplifier circuit 9 and the coil 8. Each LC circuit 14$a$ or 14$b$ here comprises a first inductance L1 of 22 μH coupled in parallel with a second inductance L2 of 1 μH and a first capacitor C1 of 63 nF, the second inductance L2 and the first capacitor C1 being coupled in series.

For this reason, a first main resonance frequency of the order of 135 KHz is obtained, together with a first impedance that is sufficiently high for the signals having a frequency of the order of 135 KHz not to be transmitted by the first matching circuit 10 to the audio amplifier circuit 9.

By way of example, this first impedance is of the order of 300 ohms, and generally speaking, equal to at least 20 ohms.

The second inductance of 1 μH is disposed within each LC circuit 14$a$ or 14$b$ so as to continue to increase the impedance of the first matching circuit 10 when the frequency of the signals transmitted to the audio amplifier circuit 9 exceeds the main resonance frequency.

Consequently, the first matching circuit is capable of prohibiting the transmission of the signals having a frequency higher than 135 KHz to the audio amplifier circuit 9 without interfering with the transmission of the audio signals having a maximum frequency at 20 KHz.

The second matching circuit 12 comprises a capacitive stage 15 and a rectification stage 17 comprising four diodes connected in a serial configuration between the transfer circuit 11 and the coil 8.

By way of non-limiting example, the capacitive stage 15 comprises a capacitive element 16, of, for example, 200 nF, coupled between a terminal of the coil 8 and the rectification stage 17.

It should be noted that the impedance of the coil 8 at the maximum frequency of the audio signals SA is of the order of 4 ohms.

The capacitive element 16 has an impedance of 40 ohms when the second matching circuit 12 receives an audio signal at 20 KHz, i.e. ten times higher than that of the coil 8.

The rectification stage 17 comprises a capacitor 18, for example, of 1 nF, and a rectifier bridge 19 coupled to the terminals of the transfer circuit 11. The rectification stage 17 is notably configured for converting the AC transfer signals ST into DC transfer signals ST so as to charge the load 5 of the device 3.

As far as transfer signals having a frequency higher than 120 KHz are concerned, the impedance of the coil and that of the capacitive element 16 are no longer compatible.

Thus, the second matching circuit 12 is capable of prohibiting the transmission of the audio signals SA having a maximum frequency of 20 KHz from the coil to the transfer circuit 11 without interfering with the transfer of the transfer signals ST at a frequency higher than 120 KHz.

In order to better establish a magnetic coupling with the emitter 2, the shape and the position of the coil 8 are advantageously chosen so as to be as accessible as possible.

For example, the coil 8 may be disposed in the immediate vicinity of the external housing of the device 3, comprise a shape analogous to that of the emitter coil and be superposed onto the emitter coil, in such a manner as to maximize the magnetic coupling between the coils of the emitter 2 and of the device 3.

In addition and preferably, no component of the loudspeaker 6 is electrically conducting except for the coil 7 in such a manner as to avoid potential interference on the audio signals SA and the transfer signals ST.

The coil 8 of the loudspeaker 6 is attached to the membrane 7. When an audio signal SA, in other words a voltage, is applied to the coil 8, an electromagnetic field is generated by virtue of a permanent magnet of the loudspeaker 6 and an electromagnetic force generated by the electromagnetic field is applied to the coil so as to make the coil 8 move, together with the membrane 7.

It is therefore possible to displace the membrane to various different positions, at variable distances from the body of the device 3, by applying various DC voltages to the coil 8.

If the emitter 2 is disposed close to the body of the device 3, the electromagnetic coupling between the emitter coil and the coil 8 of the loudspeaker 6 varies as a function of the position of the membrane 7.

Consequently, a DC voltage applied to the coil 8 allows the electromagnetic coupling between the emitter coil and the coil 8 of the loudspeaker 6 to be adjusted for the contactless transfer of energy by virtue of a variation of the position of the coil.

With a suitable algorithm, the contactless transfer of energy may therefore be controlled by adjusting the DC voltage applied to the coil. By way of example, the electromagnetic coupling can be reduced in order to obtain a higher power in the contactless transfer of energy or the electromagnetic coupling may be increased in order to improve the efficiency of the transfer.

For this purpose, the device 3 advantageously furthermore comprises a control circuit 20 coupled to the terminals of the coil 8 of the loudspeaker 6 and configured for controlling the DC voltage applied to the coil 8.

Figure 3:
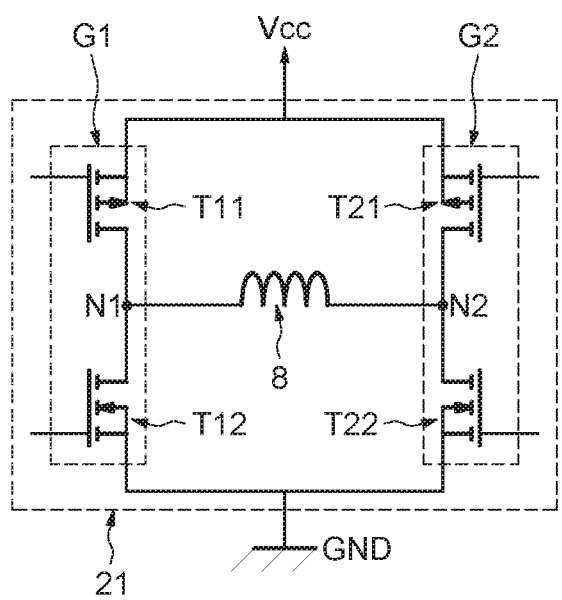

Reference is now made to FIG. 3 in order to illustrate another embodiment in which the first and second modules M1 and M2 operate in an exclusive manner.

In other words, only one of the two modules M1 and M2 can be operational. In that case, the device 3 comprises a driver circuit 21 coupled to the terminals of the coil 8 and configured for driving, in a respective and exclusive manner, the first and second modules M1 and M2 of the device 3.

By way of non-limiting example, the driver circuit 21 comprises a conventional differential power driver stage having a first group G1 and a second group G2 of MOSFET transistors coupled between a power supply source Vcc and ground GND. Each group comprises two MOSFET transistors T11, T12, T21, T22 coupled in series. The mid-points N1 and N2 of these groups are respectively coupled to the terminals of the coil 8.

When the driver circuit 21 is driven by an audio control circuit (not shown in FIG. 3), the coil 8 is consequently configured for transmitting the electrical signal SE. A current is drawn from the power supply source Vcc and flows in the coil 8 in such a manner as to drive the movement of the membrane 7.

When the driver circuit 21 is controlled by a transfer control circuit (not shown in FIG. 3), the coil 8 is energized with an AC current by the emitter 2 via the magnetic coupling. If the mid-point N1 of the first group is at a high voltage, the transistors T12 and T21 are in their conducting state, whereas the transistors T11 and T22 are in their OFF state. A current flowing in the coil 8 will be injected into the power supply source Vcc, in other words the power supply source Vcc is charged up, acting as a load 5 of the device 3, by the current flowing in the coil 8.

By analogy, if the mid-point N2 of the second group is at a high voltage, the transistors T11 and T22 are in their conducting state and the power supply source Vcc is still being charged by the current flowing in the coil 8.

What is claimed is:

1. A method for contactless energy transfer between an emitter and a device, the method comprising:
   receiving an audio signal with a first module, the first module comprising an electromagnetic loudspeaker having an inductive element configured to drive a membrane of the electromagnetic loudspeaker, wherein changes in a position of the inductive element cause movements of the membrane; and
   transferring energy from the emitter to a load via the inductive element.

2. The method of claim 1, further comprising reproducing audio via the electromagnetic loudspeaker using the first module at the same time as transferring energy from the emitter to the load via the inductive element.

3. The method of claim 1, wherein: the audio signal comprises frequencies lower than 20 KHz; and a signal for transferring energy from the emitter to the load comprises frequencies higher than 100 KHz.

4. The method of claim 3, wherein: the audio signal consists of frequencies lower than 20 KHz; and a signal for transferring energy from the emitter to the load consists of frequencies higher than 100 KHz.

5. The method of claim 1, wherein transferring energy from the emitter to the load comprises transferring energy according to the Qi standard.

6. The method of claim 1, further comprising applying a DC voltage to the inductive element.

7. The method claim 6, further comprising controlling transferring energy from the emitter to the load by adjusting the DC voltage applies to the inductive element.

8. A device comprising:
   a first module comprising an electromagnetic loudspeaker having an inductive element configured to drive a membrane of the electromagnetic loudspeaker so that changes in a position of the inductive element cause movements of the membrane; and a second module coupled between the inductive element and a load, the second module configured to carry out a contactless transfer of energy from an emitter to the load via the inductive element.

9. The device of claim 8, wherein the load comprises a rechargeable battery.

10. The device of claim 8, wherein: the first module comprises an audio amplifier circuit configured to transmit first signals to the inductive element, and a first matching circuit coupled between the inductive element and the audio amplifier circuit; the second module comprises a transfer circuit configured to receive second signals from the inductive element, and a second matching circuit coupled between the inductive element and the transfer circuit; the first matching circuit is configured to allow a transmission of the first signals to the inductive element and for prohibiting a transfer of the second signals to the audio amplifier circuit; and the second matching circuit is configured to allow a transmission of the second signals to the transfer circuit and for prohibiting a transfer of the first signals to the transfer circuit.

11. The device of claim 10, wherein: the first matching circuit comprises a resonant circuit having a main resonance frequency and configured to exhibit a first impedance between the audio amplifier circuit and the inductive element when the second signals have a frequency higher than the main resonance frequency; and prohibiting the transfer of the second signals to the audio amplifier circuit is based on the first impedance.

12. The device of claim 11, wherein the first impedance has a value greater or equal to 20 ohms.

13. The device of claim 12, wherein the first impedance has a value greater or equal to 200 ohms.

14. The device of claim 10, wherein: the second matching circuit comprises a capacitive stage configured to exhibit a second impedance when the first signals are received;

and the second impedance is higher than an impedance of the inductive element.

15. The device of claim 14, wherein the second impedance is at least ten times higher than the impedance of the inductive element.

16. The device of claim 8, further comprising a driver circuit coupled to the inductive element and configured to drive, respectively and exclusively, the first and second modules.

17. The device of claim 8, furthermore comprising a control circuit configured to apply a DC voltage to the inductive element.

18. A device comprising:
an audio amplifier circuit configured to be coupled to a coil, the audio amplifier circuit configured to drive a membrane of a loudspeaker via the coil so that changes in a position of the coil cause movements of the membrane; and a rectifier circuit configured to be coupled between the coil and a load, the rectifier circuit configured to receive energy from an emitter via contactless communication using the coil.

19. The device of claim 18, further comprising the coil and the load, wherein the load comprises a battery.

20. The device of claim 19, further comprising an external housing, wherein the coil is disposed in the immediate vicinity of the external housing.

21. The device of claim 19, wherein the coil comprises a shape analogous to a shape of a coil of the emitter.

22. The device of claim 18, further comprising: a first matching circuit coupled to an output of the audio amplifier circuit; and a capacitive stage coupled to an input of the rectifier circuit.

23. The device of claim 22, wherein the first matching circuit comprises:
a first inductor; and
an LC tank comprising a second inductor in series with a first capacitor, the first inductor coupled in parallel with the LC tank.

24. The device of claim 23, wherein: the first inductor comprises an inductance of 22 uH; the second inductor comprises an inductance of 1 uH; the first capacitor comprises a capacitance of 63 nF; and the capacitive stage comprises a second capacitor having a capacitance of 200 nF.

25. The device of claim 18, further comprising a wireless speaker or an MP3 player.

* * * * *